United States Patent [19]
Barish et al.

[11] Patent Number: 4,967,151
[45] Date of Patent: Oct. 30, 1990

[54] METHOD AND APPARATUS FOR DETECTING FAULTS IN DIFFERENTIAL CURRENT SWITCHING LOGIC CIRCUITS

[75] Inventors: Arnold E. Barish; David A. Kiesling, both of Pleasant Valley; Mark D. Mayo, Poughkeepsie; Walter A. Svarczkopf, Walden, all of N.Y.

[73] Assignee: International Business Machines Corporation, Armonk, N.Y.

[21] Appl. No.: 420,690

[22] Filed: Oct. 11, 1989

Related U.S. Application Data

[63] Continuation of Ser. No. 232,978, Aug. 17, 1988, abandoned.

[51] Int. Cl.$^5$ .................... G01R 31/00; G01R 31/26
[52] U.S. Cl. ........................ 324/158 T; 324/158 R; 307/354; 307/355
[58] Field of Search ............... 307/494, 451, 443, 355, 307/354; 324/158 R, 158 T

[56] References Cited

U.S. PATENT DOCUMENTS

| | | | |
|---|---|---|---|
| 3,925,691 | 12/1975 | Gaskill, Jr. et al. | 307/300 |
| 4,069,428 | 1/1978 | Rudy | 307/215 |
| 4,127,813 | 11/1978 | Hiroshima et al. | 307/355 |
| 4,156,819 | 5/1979 | Takahashi et al. | 307/272 |
| 4,311,925 | 1/1982 | Chang et al. | 307/455 |
| 4,339,710 | 7/1982 | Happe | 324/73 R |
| 4,410,816 | 10/1983 | Komai | 307/455 |
| 4,608,667 | 8/1986 | Barry | 365/189 |
| 4,625,310 | 11/1986 | Mercer | 371/15 |
| 4,656,417 | 4/1987 | Kirkpatrick et al. | 324/73 R |
| 4,829,479 | 5/1989 | Mitsumoto et al. | 307/495 |
| 4,835,417 | 5/1989 | Kousaka et al. | 307/494 |
| 4,857,767 | 8/1989 | Little et al. | 307/443 |

OTHER PUBLICATIONS

"Test Methodology for Detecting Missing Emitter Follower Resistors for Differential Current Switch Circuits", by Rizzolo, IBM Tech. Disc. Bull., vol. 30, #3, 8/87, pp. 1269-1270.

"Open Line Detect Differential Driver Circuit for Chips", by Schmerbeck, IBM Tech. Disc. Bull., vol. 30, #5, 10/87, pp. 73-74.

Primary Examiner—Reinhard J. Eisenzopf
Assistant Examiner—W. Burns
Attorney, Agent, or Firm—Jeffrey L. Brandt

[57] ABSTRACT

A circuit for testing a differential current switching logic circuit of the type including: a bias potential, two resistors connected to the bias potential, and apparatus responsive to an input signal for sinking a first current through a selected one of the resistors so as to generate first and second differential output signals at the resistors. The circuit includes first, second, and third transistors, each having first and second terminals for conducting a current responsive to a signal applied to a control terminal. Apparatus are provided for supplying a current. The first transistor has its first terminal connected to the current supplying means, and its second terminal connected to a circuit node. The second transistor has its first terminal connected to the circuit node, its second terminal connected to the bias potential, and its control terminal connected to sense the potential at a selected one of the resistors. The third transistor has its first terminal connected to the circuit node, its second terminal connected to the selected resistor, and its control terminal connected to sense the potential at the other of the resistors. The circuit functions to sense the potential difference between the first and second differential output signals. When the potential difference is less than a predetermined level, a second current is sunk through the one resistor so as to lower the potential of the output signal associated with the one resistor relative to the potential of the output signal associated with the other resistor.

22 Claims, 4 Drawing Sheets

| | EN=1,and | |
|---|---|---|
| IA1,IA2 | IB1,IB2 | OA1,OA2 |
| 0,1 | 0,1 | 0,1 |
| 0,1 | 1,0 | 1,0 |
| 1,0 | 0,1 | 1,0 |
| 1,0 | 1,0 | 1,0 |

METHOD AND APPARATUS FOR DETECTING FAULTS IN DIFFERENTIAL CURRENT SWITCHING LOGIC CIRCUITS

This application is a continuation of application Ser. No. 232,978, filed Aug. 17, 1988, now abandoned.

The present invention relates generally to the testing of logic circuits, and more particularly to a method and apparatus for detecting stuck-near-threshold faults in differential current switching logic circuits.

BACKGROUND OF THE INVENTION

A well recognized problem in the testing of logic circuits embedded on integrated circuit chips is that of the unavailability of the circuit input and output connections. This unavailability is due to the limited number of input/output (I/O) pins available on the chip package. To test these embedded circuits, various means such as level sensitive scan design (LSSD) shift registers have been developed for applying test data and reading test results through a limited number of I/O pins. Assuming that the correct types of test data are applied through these means, many types of logic circuit faults become readily detectable. Stuck-at-level faults, for example, wherein the output of a logic circuit is stuck at a logical level, are typically readily detectable through the LSSD shift registers.

Other types of logical circuit faults are not readily detectable solely through the use of the above described test means, and require the co-location of dedicated test circuitry with the logic circuits to be tested. U.S. Pat. No. 4,410,816 to Kanai, for example, shows an emitter-coupled-logic (ECL) circuit wherein a test circuit is provided for aiding in the detection of open circuit faults at the emitter of an emitter-follower output stage.

One type of logic fault which has not been adequately addressed by the prior art is that known as a "stuck-near-threshold" fault. When a stuck-near-threshold fault occurs, the output of a logic element becomes stuck near the threshold differentiating its high and low logical states. As described above, the output of a logic circuit exhibiting such an error must at least be registered, and often propagated through subsequent logical circuit stages, before being available at a chip output. Because the logic circuit output is stuck close to the logical threshold, it may be registered, or detected at subsequent stages, at varying times as either a logical high, or a logical low. This makes reliable and repeatable detection of the stuck-near-threshold fault very difficult.

The present invention is directed to the detection of such stuck-near-threshold faults in differential current switching (DCS) logic elements. It has particular application to such DCS elements embedded on integrated circuit chips.

U.S. Pat. No. 4,656,417, to Kirkpatrick et al., (assigned to the assignee of the present invention) shows a test circuit for detecting stuck-near-threshold faults in a differential cascode voltage switch. The circuit in Kirkpatrick et al. tests for two invalid states (0,0 and 1,1), and holds the fault in a latch. The Kirkpatrick et al. circuit, however, does not show or suggest a means for detecting such faults in a DCS circuit.

Referring now to FIG. 1, a conventional DCS logic circuit 10 is shown including a differential current switch 11, responsive to input signals applied on terminals 12a, 12b, for steering a current I1 selectively through a resistor R1 or a resistor R2. DCS 11 comprises, for example, an emitter-coupled logic (ECL) arrangement of bipolar transistors, many configurations of which are well known to those skilled in the art. A bias potential $V_{CC}$ is applied to DCS 11 through resistors R1, R2. In operation, as current I1 is directed selectively through resistor R1 or R2, the voltage signals at circuit nodes A, B between resistors R1, R2 and DCS 11 change levels relative to one another. The relative polarities of the signals at circuit nodes A, B indicate a logical low/0 or a logical high/1 signal to a subsequent logic circuit (not shown).

Referring now to FIG. 2, a graph 14 is shown illustrating a proper logical output for circuit 10. Graph 14 shows the signals at nodes A, B plotted against a vertical axis V representing voltage and a horizontal axis T representing time. Reference levels on voltage axis V are indicated at HI, TH(reshold), and LO. In accordance with a proper logical output for a DCS circuit, the HI voltage level at node A is above threshold voltage level TH, the LO voltage level at node B is below the threshold voltage level, and the difference voltage $V_D$ between the voltage levels at nodes A and B is greater than a stuck-near-threshold voltage range $V_{SNT}$. Stuck-near-threshold voltage range $V_{SNT}$ is centered about the threshold voltage level TH, and comprises a selected voltage range, for example 0.15 volts for bipolar logic, below which noise prevents a correct determination of the logic signal with acceptable accuracy. With the relative signal levels $A > B$ defined as a logical 1, and $B > A$ defined as a logical 0, circuit 10 is thus outputting a valid logical 1. It will be understood that the voltages HI, Th, and LO are relative as described above, and that threshold voltage level TH needn't be centered between the bounding two. It will be further understood that, if circuit 10 were operated to provide a logical output of 0, the signals at nodes A, B would reverse polarity with respect to threshold level TH, and again differ by at least stuck-near-threshold voltage range $V_{SNT}$.

FIG. 3 comprises a plot 16 identical to plot 14 excepting that it illustrates the signals present at nodes A, B when circuit 10 exhibits a stuck-near-threshold fault. As shown, the signals at nodes A, B are stuck near the HI voltage, and, more importantly, do not differ from each other by at least stuck-near-threshold voltage range $V_{SNT}$. It will be understood that the stuck-near-threshold fault is characterized by the relative difference between the output voltages being less than the stuck-near-threshold voltage range $V_{SNT}$, regardless of the voltage levels at which the output voltages are stuck.

Referring now to FIG. 4, a prior art circuit 10' is shown which operates to help in identifying stuck-near-threshold faults in DCS logic circuits. Circuit 10' is identical in construction to circuit 10 of FIG. 1 above, with the exception of the application of a separate bias potential $V'_{CC}$ to resistor R2. Identical elements between FIGS. 1 and 4 are indicated with like reference numbers. Bias potentials $V'_{CC}$, and $V_{CC}$ are selected such that, when no current is steered through resistors R1 or R2, the inherent potential difference between circuit nodes A, B is greater than the threshold voltage for circuit 10'.

In normal operation, the steering of current I1 through resistors R1 or R2 establishes output signals at nodes A, B exhibiting a potential difference sufficient to overcome the above-described inherent potential difference, thereby providing a valid logical signal output.

When, however, there is a fault in circuit 10' such that the output signals on circuit nodes A, B would otherwise exhibit a stuck-near-threshold fault, the inherent potential difference established between bias potentials $V_{CC}$ and $V'_{CC}$ across resistors R1, R2 is sufficient to pull the output signals to predetermined levels, establishing what appears to be a stuck-at-level (i.e. stuck-at-zero or stuck-at-one) fault. As described above, these stuck-at-zero and stuck-at-one faults are detectable through the application of appropriate test data. While the exact nature of the circuit fault (i.e. stuck-near-threshold) may not be known, the circuit is never the less identified as bad.

While circuit 10' includes features which function to help identify stuck-at-threshold faults in differential current switching logic circuits, these features cause circuits incorporating them to exhibit significant operational disadvantages. More specifically, circuits employing the voltage divider and inherent potential difference of circuit 10' above exhibit reduced noise margins, and require a relatively large signal swing to overcome the inherent potential difference. This large signal swing requires significant circuit delays, making circuit 10' substantially slower in operation than circuit 10 (FIG. 1). Additionally, the requirement to supply second bias potential $V'_{CC}$ to each DCS circuit significantly increases the overhead and hence cost of an integrated circuit chip.

SUMMARY OF THE INVENTION

A principal object of the present invention is to provide a new and improved method and apparatus for aiding in the detection of stuck-near-threshold faults in differential current switching logic circuits.

Another object of the present invention is to provide such a method and apparatus which minimizes circuit delays by requiring only minimal output signal swings.

A further object of the present invention is to provide a method and apparatus of the above-described type which can be implemented in an integrated circuit environment using a small number of readily available components.

Yet another object of the present invention is to provide such a method and apparatus which does not noticeably reduce the noise margin of the circuits.

In accordance with one embodiment of the present invention, there is provided a new and improved method of testing an electronic logic circuit of the type responsive to an input signal for generating first and second differential output signals, the method comprising the steps of: applying the input signal to the logic circuit; sensing, by comparing at least two discrete signals, the potential difference between the differential output signals; and shifting, when the potential difference is less than a predetermined level, the first and second differential output signals at least a minimum potential difference apart.

In accordance with another embodiment of the present invention, there is provided means for testing an electronic logic circuit of the type responsive to an input signal for generating first and second differential output signals, comprising: means for applying the input signal to the logic circuit; means for sensing, including means for comparing at least two discrete signals, the potential difference between the first and second differential output signals; and means for shifting, when the potential difference is less than a predetermined level, the first and second differential output signals at least a minimum potential difference apart.

BRIEF DESCRIPTION OF THE DRAWINGS

These and other objects, features, and advantages of the present invention will become apparent upon a consideration of the following detailed description when read in conjunction with the drawing figures, in which.

DETAILED DESCRIPTION OF THE INVENTION

Figure 5:
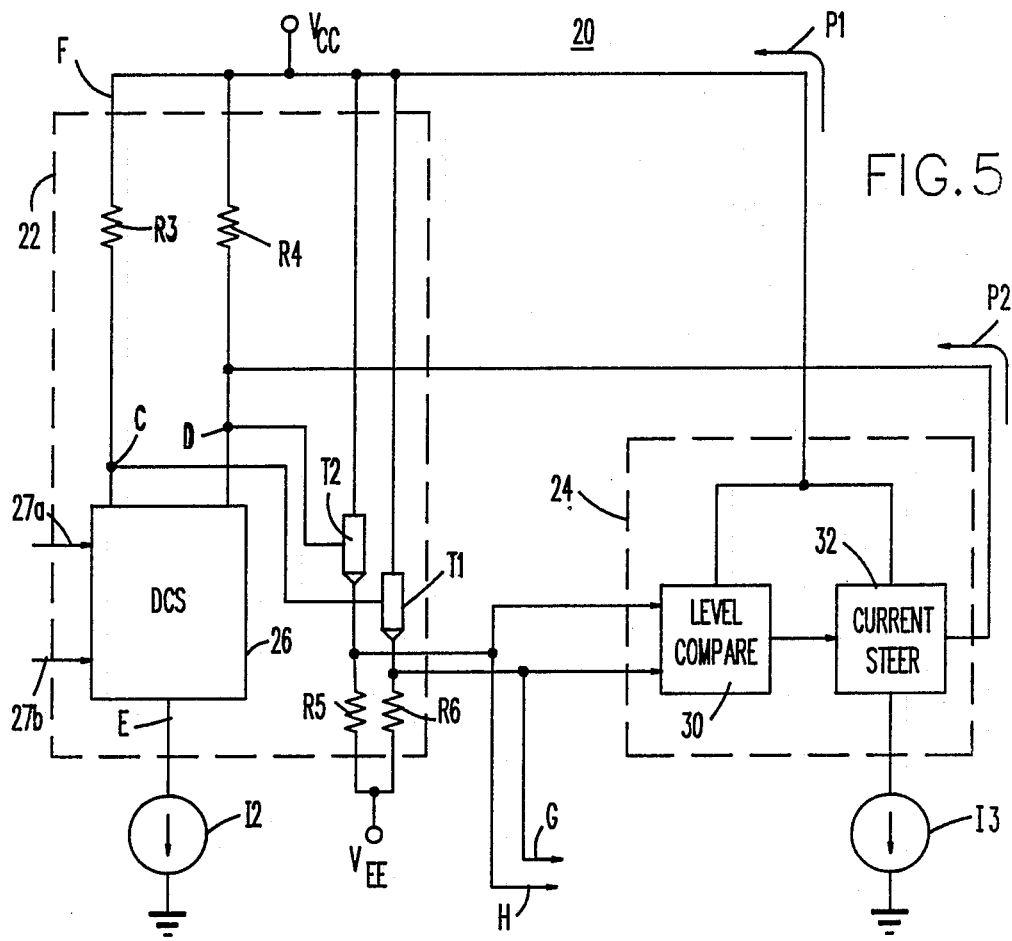
FIG. 5 is a block diagram of a generic, differential current switching logic circuit incorporating features of the present invention.

Referring now to FIG. 5, a circuit 20 is shown including a generic, differential current switching (DCS) logic circuit 22, and a test circuit 24 constructed in accordance with the present invention. Circuit 20 typically comprises one of many such circuits embedded internally on a large scale integrated circuit chip (not shown).

Circuit 22 includes a differential current switch (DCS) 26 connected to a pair of resistors R3, R4 at circuit nodes C, D, respectively. DCS 26 comprises, for example, an emitter-coupled logic (ECL) arrangement of bipolar transistors, many configurations of which are well known to those skilled in the art. Circuit 22 is biased by a current source I2 applied at a circuit node E, and a voltage source $V_{CC}$ applied through resistors R3, R4 at a circuit node F. A pair of input terminals 27a, 27b are shown for supplying logical signal inputs to DCS 26, the number of inputs required depending, of course, on the type of logic switch configured in DCS 26.

Circuit 20 further includes a pair of bipolar, npn transistors T1, T2 configured as emitter-followers relative to circuit nodes C, D, respectively. Transistor T1 includes a base connected to circuit node C, a collector connected to bias potential $V_{CC}$, and an emitter connected to a bias potential $V_{EE}$ through a resistor R6. Transistor T2 includes a base connected to circuit node D, a collector connected to bias potential $V_{CC}$, and an emitter connected to bias potential $V_{EE}$ through a resistor R5. Circuit nodes G, H are indicated at the emitters of transistors T1, T2, respectively.

Referring still to FIG. 5, test circuit 24 comprises, functionally, a means 30 for comparing the relative levels of differential signals, and a means 32 responsive to comparing means 30 for selectively steering a current. An exemplary embodiment of circuitry for performing these functions is shown and described in detail with respect to FIGS. 7 and 8 below. Level compare means 30 is connected to circuit nodes G, H, to current steering means 32, and to bias potential $V_{CC}$. Current steering means 32 is connected to bias potential $V_{CC}$, to current source I3, and to circuit node D.

In operation, test circuit 24 functions to make stuck-near-threshold faults in DCS logic circuit 22 reliably and repeatably detectable without incurring the operational disadvantages of the prior art described hereinabove.

Figure 1:
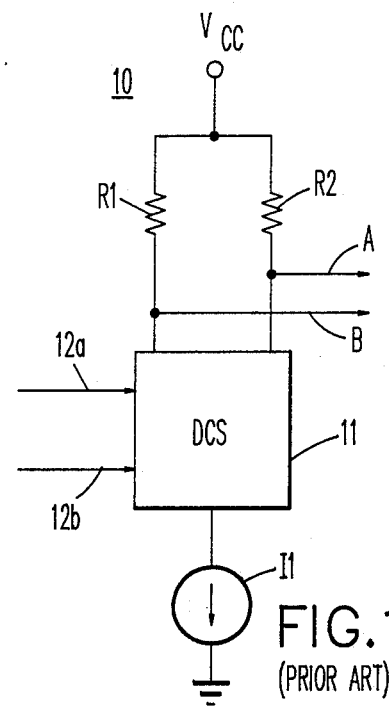
FIG. 1 is a block diagram of a generic, differential current switching logic circuit as described hereinabove.
Figure 2:
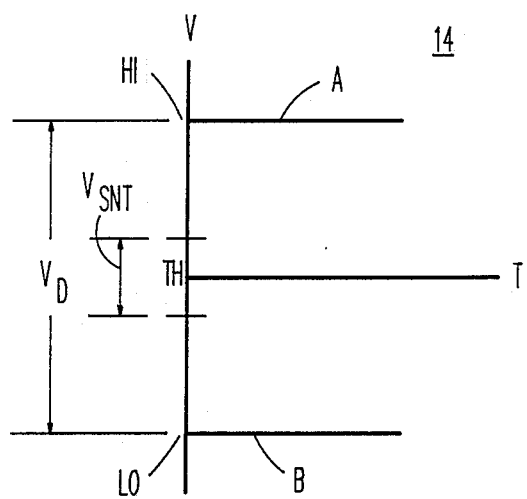
FIG. 2 is a graph illustrating the correct operation of circuit 10 of FIG. 1, as described hereinabove.

It will be appreciated from a consideration of FIGS. 1 and 5 that logic circuit 22 is identical in construction and in operation to circuit 10 (FIG. 1) above, with the exception of the addition of emitter-follower transistors T1, T2. It will further be appreciated that, because of the emitter-follower operation of transistors T1, T2, the voltage signals at circuit nodes G, H follow the voltage signals at circuit nodes C, D, respectively, minus the diode drop across the base-emitter junctions of the transistors. Thus, when circuit 22 is operating properly, the signals at nodes G, H will exhibit potential differences of at least stuck-near-threshold voltage range $V_{SNT}$ as shown in FIG. 3 above.

When level compare means 30 senses that the signals on circuit nodes G, H represent a proper logical signal, it directs current steering means 32 to steer current 32 so as not to change that signal. Accordingly, if the signals at nodes G (and C, i.e. G/C), and H (and D, i.e. H/D) are low, high, respectively, level compare means 30 directs current steering means 32 to steer current I3 directly to bias potential $V_{CC}$ via current path P1. The signals at circuit nodes G/C and H/D are thus unaffected. If the signals at nodes G/C, and H/D are high, low, respectively, level compare means 30 directs current steering means 32 to steer current I3 either to bias potential $V_{CC}$ via path P1, or to circuit node D via path P2. When current I3 is steered directly to bias potential $V_{CC}$, the signals at nodes G/C, H/D are unaffected. When current I3 is steered to bias potential $V_{CC}$ through circuit node D and resistor R4 (i.e. path P2), the current functions to pull the node even lower, hence reinforcing the logical low signal present at node H/D, and leaving the differential logical output unchanged.

Figure 4:
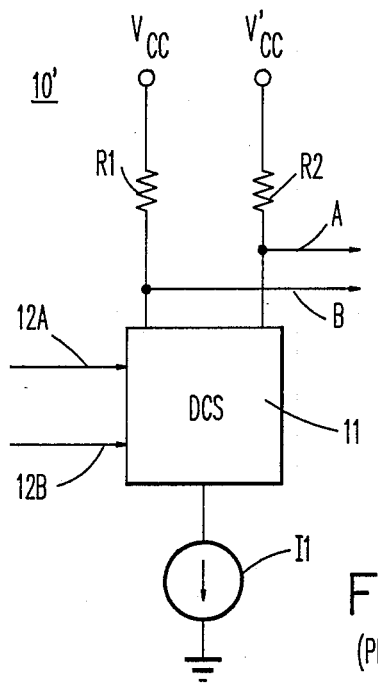
FIG. 4 is a block diagram of a generic differential current switching logic circuit employing known means for aiding in the detection of stuck-near-threshold faults as described hereinabove.
Figure 3:
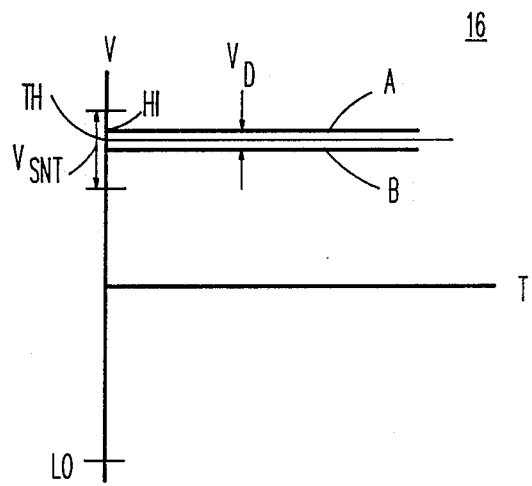
FIG. 3 is a graph illustrating a stuck-near-threshold fault in the operation of circuit 10 of FIG. 1, as described hereinabove.
Figure 6:
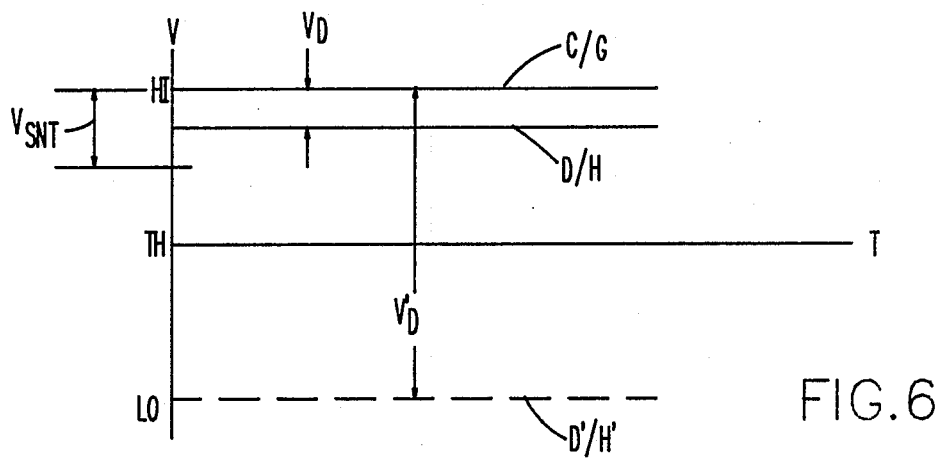
FIG. 6 is a graph illustrating the operation of the circuit of FIG. 5.

Considering now FIGS. 5 and 6 together, graph 33 is similar to graphs 14 and 16 of FIGS. 3, 4 above, illustrating plots of circuit nodes G, H when logic circuit 22 is exhibiting a stuck-near-threshold fault. As shown, the potential difference $V_D$ between circuit nodes G, H is less than the stuck-near-threshold voltage range $V_{SNT}$.

When compare means 30 of test circuit 24 senses that the signals at nodes G, H are exhibiting a potential difference of less than voltage range $V_{SNT}$, i.e. a stuck-near-threshold fault, it activates current steering means 32 to steer current I3 to bias potential $V_{CC}$ through circuit node D and resistor R4 (i.e. through path P2). When current I3 is thus sunk through resistor R4, the potential of the signal at node D/H is substantially lowered relative to the potential of the signal at node C/G, this lower potential being shown by plot D'/H' of FIG. 6. With the level of current I3 appropriately selected, the potential difference $V'_D$ is thus forced to a value greater than stuck-near-threshold voltage range $V_{SNT}$.

Reviewing the operation described above, responsive to the detection of a stuck-near-threshold fault at the output of circuit 22, and irrespective of the values of the input signals on terminals 27a, 27b, test circuit 24 operates to force the signals at circuit nodes G, H to represent a logical 1. This forcing of the output to a logical 1 will be repeated every time circuit 24 senses the stuck-near-threshold fault at nodes G, H. Thus, as the input signals on terminals 27a, 27b are varied to test the operation of circuit 20, the stuck-near-threshold fault will be reliably and repeatedly detected as a stuck-at-logic-level 1 fault.

Considering now a stuck-near-threshold fault where nodes G, H are stuck at low voltage levels, the operation of circuit 20 is identical to that described immediately above. Upon the detection of the stuck-near-threshold fault by level compare means 30, current I3 will be steered by current steering means 32 through resistor R4. Node D/H will thus be pulled to a voltage level at least a stuck-near-threshold voltage range $V_{SNT}$ less than than the voltage level of the signal on node C/G. A logical 1 will thus be forced at the output of circuit 22, indicating a stuck-near-threshold fault in the manner described above.

Figures 7, 9:
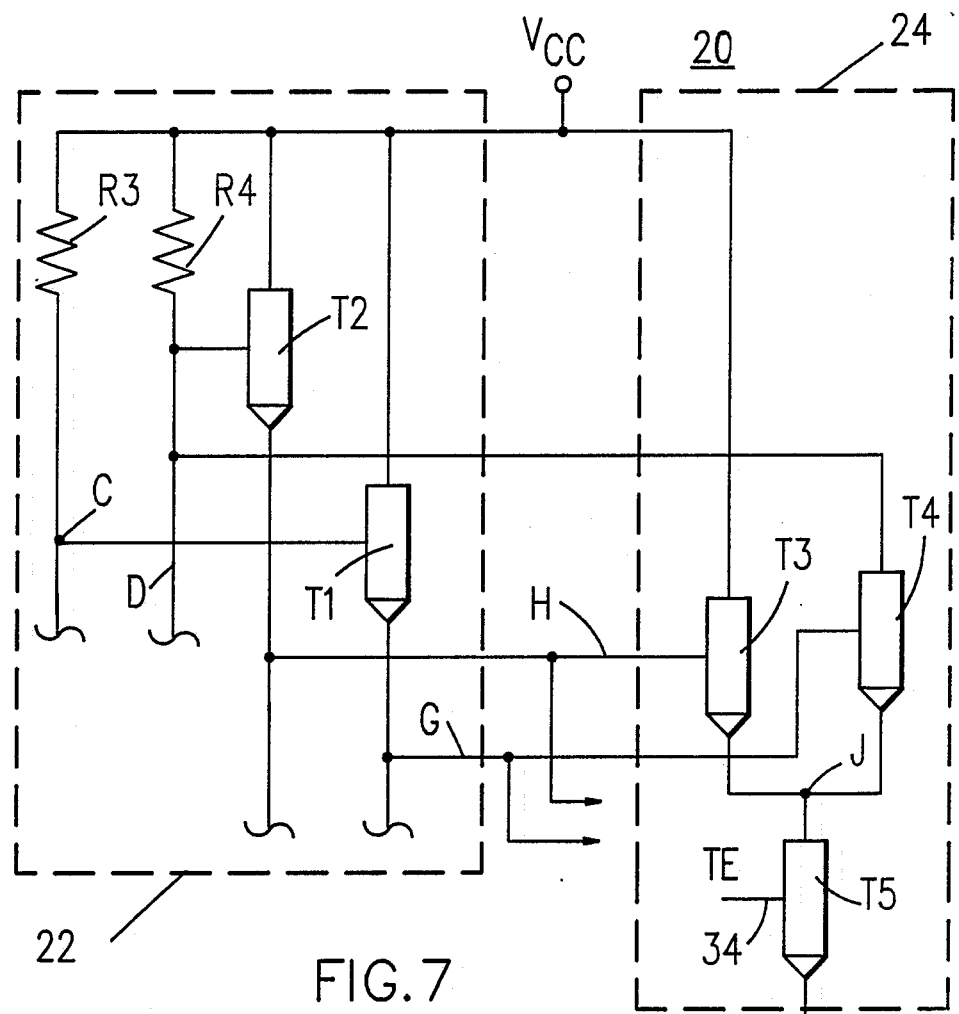
FIG. 7 is a circuit diagram illustrating one embodiment of the test circuit 24 of FIG. 5.
FIG. 9 is a state chart describing the operation of logical OR gate 42 of FIG. 8.

Referring now to FIG. 7, an exemplary embodiment of test circuit 24 is shown including three bipolar, npn transistors T3, T4, T5. Transistor T3 has a collector connected to bias potential $V_{CC}$, a base connected to node H, and an emitter connected to a circuit node J. Transistor T4 has a collector connected to circuit node D, a base connected to circuit node G, and an emitter connected to circuit node J. Transistor T5 has a collector connected to circuit node J, a base connected to a terminal 34 for receiving a test enable control signal TE, and an emitter connected to current source I3.

The operation of circuit 24 will first be described with respect to a proper operation of circuit 22, i.e. no stuck-near-threshold fault exhibited at circuit nodes C/G, D/H. When a logical 1 is present at the output of circuit 22, node C/G is at a relatively higher voltage than node D/H. Test Enable signal TE is applied to enable transistor T3 to conduct current, and initiate the operation of circuit 24. Subsequently, the higher voltage on node C/G switches transistor T4 on, while the lower voltage on node D/H switches transistor T3 off. The current I3 is thus "steered" by transistor T4 through resistor R4, further lowering the voltage of the signal at circuit node D/H, leaving the logical output of circuit 22 unchanged.

When a logical 0 is present at the output of circuit 22, node C/G is at a relatively lower voltage than node D/H. Transistor T3 is switched on, while transistor T4 is switched off. Current I3 is thus steered by transistor T3 directly to bias voltage $V_{CC}$, leaving the logical output of circuit 22 unchanged.

It is thus seen that test circuit 24 does not affect the logical operation of circuit 22 when no stuck-near-threshold error is present.

Examining now the operation of circuit 20 when a stuck-near-threshold error is present at nodes C/G, D/H of circuit 22, it will be assumed that the nodes are both stuck at a high level (i.e. as shown in FIG. 6). When test enable signal TE is applied to terminal 34 on transistor T5, current I3 is at first split relatively equally between transistors T3 and T4. The portion of current I3 steered by transistor T3 directly to bias potential $V_{CC}$ has no effect on circuit 22. However, the portion of current I3 steered by transistor T4 through resistor R4 has the effect of lowering the signal voltage at node D, thereby shutting transistor T2 and hence transistor T3 off. All of current I3 is subsequently steered by transistor T4 through resistor R4, pulling the signal at node D/H to a low voltage level relative to the signal at node C/G, and forcing the output of circuit 22 to a logical 1. This logical 1 output will be forced every time a stuck-near-threshold fault is present, regardless of the inputs to circuit 22. The stuck-near-threshold fault will thus be reliably and repeatably detectable as a stuck-at-level fault in the manner described above.

If the output signals of circuit 22 were stuck-near-threshold at low voltage levels, circuit 24 would operate in substantially the same manner to pull the signal voltage at node D/H relatively lower than the signal voltage at node C/G. Circuit 24 would thereby force the same stuck-at 1 fault described immediately above.

It will be appreciated that, while in the circuits shown in FIGS. 5 and 7 the differential output signals are shown as being sensed at the emitters of emitter-follower transistors, these signals could be sensed at the circuit connection between the differential current switch and the resistors to bias potential $V_{CC}$. That is, in circuit 20 of FIG. 5, level compare 30 can alternately be connected to circuit nodes C, D. In circuit 20 of FIG. 7, the bases of transistors T3, T4 could alternately be connected to circuit nodes D, C, respectively. Sensing of the differential signals at the final output of the circuit (i.e. the emitters of the emitter-followers), however, permits the present invention to further identify short circuits between interconnect wires in a manner which is discussed in further detail below.

From a consideration of the above, it will be appreciated that, for the present invention to function to identify stuck-near-threshold errors in a differential current switching logic circuit, two conditions must exist. First, a test data pattern must be applied to the logic circuit which steers the internal current source (i.e. current source I2 of FIG. 5) towards the faulty device or connection. Second, test circuit 24 must be able to steer the bias current (i.e. current source I3 of FIG. 5) to pull down the output node on the good side of the circuit. It will thus be understood that, when only one such circuit 24 is used with a DCS logic circuit, only approximately half the possible stuck-near-threshold errors in the DCS logic circuit can be identified.

Figure 8:
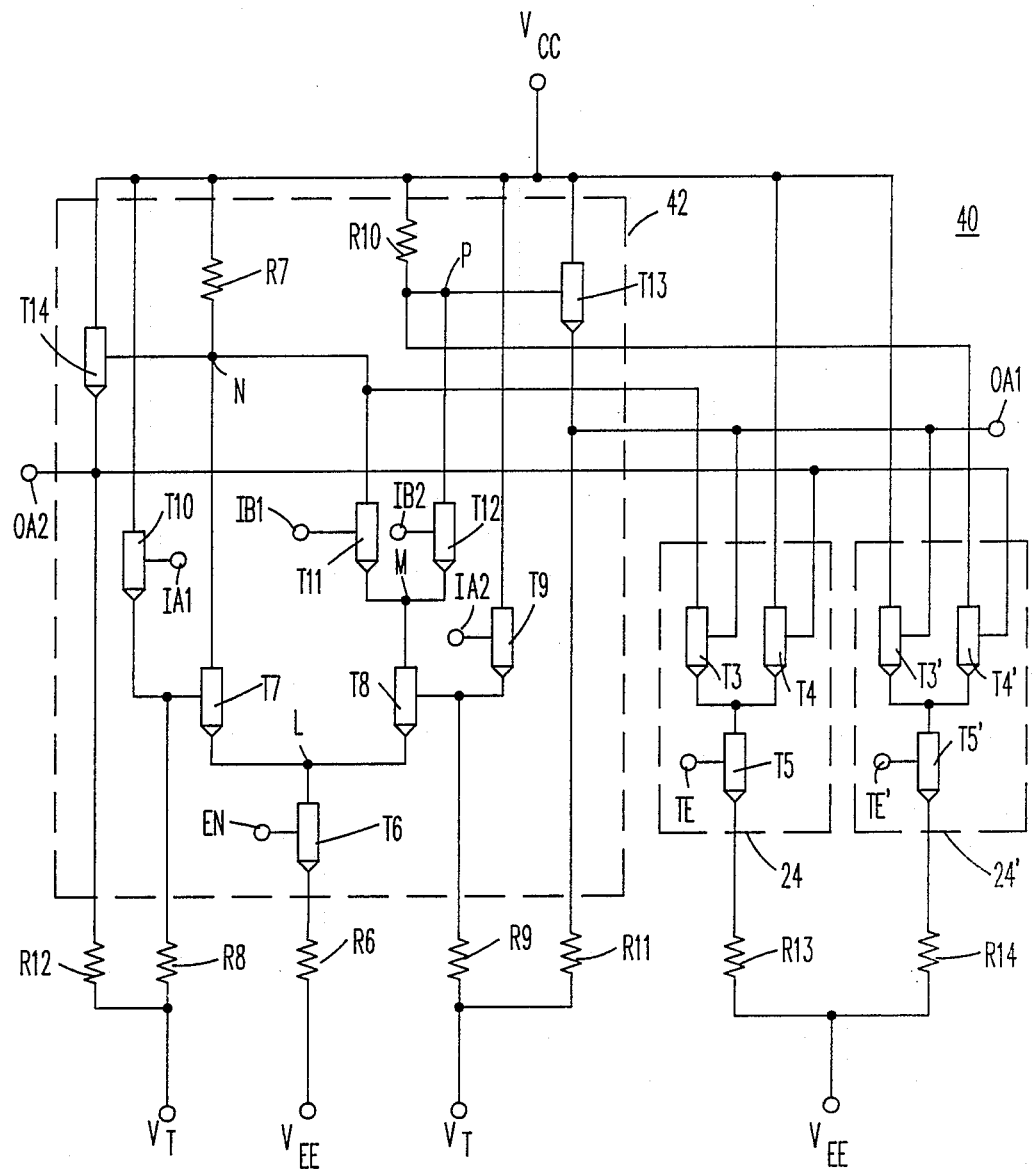
FIG. 8 is a circuit diagram of a differential current switching OR gate constructed in accordance with the present invention.

Referring now to FIG. 8, a circuit 40 is shown which includes two copies of test circuit 24 (FIG. 7), indicated at 24 and 24', connected to operate with a cascode DCS OR circuit 42. Circuits 24, 24' are identical in construction, the elements of the latter being indicated with like, primed reference numbers for purposes of description.

Examining now the construction of circuit 42, a transistor T6 has an emitter connected to bias potential $V_{EE}$ through a resistor R6, a collector connected to a circuit node L, and a base connected to a terminal EN for receiving an enable signal. A transistor T7 has an emitter connected to node L, a base connected to a bias potential $V_T$ through a resistor R8, and a collector connected a circuit node N. Circuit node N is in turn connected to bias potential $V_{CC}$ through a resistor R7. A transistor T8 has an emitter connected to node L, a base connected to bias potential $V_T$ through a resistor R9, and a collector connected to a circuit node M. A transistor T9 has an emitter connected to bias potential $V_T$ through resistor R9, a base connected to a terminal IA2 for receiving an input signal, and a collector connected to bias potential $V_{CC}$. A transistor T10 has an emitter connected to bias potential $V_T$ through resistor R8, a collector connected to bias potential $V_{CC}$, and a base connected to a terminal IA1 for receiving an input signal. A transistor T11 has an emitter connected to circuit node M, a collector connected to circuit node N, and a base connected to a terminal IB1 for receiving an input signal. A transistor T12 has an emitter connected to circuit node M, a collector connected to a circuit node P, and a base connected to an input terminal IB2 for receiving an input signal. Node P is connected to bias potential $V_{CC}$ through a resistor R10.

A pair of transistors T13, T14 are connected as emitter-followers, each having a collector connected to bias potential $V_{CC}$, and an emitter connected to bias potential $V_T$ through resistors R11, R12, respectively. Transistor T13 has a base connected to node P, and transistor T14 has a base connected to node N. Output terminals OA1, OA2 are connected at the emitters of transistors T13, T14, respectively.

Examining now the connection of test circuits 24, 24' to logic circuit 42, the emitters of transistors T5, T5' are connected to bias potential $V_{EE}$ through resistors R13, R14, respectively. In circuit 24, the collector of transistor T3 is connected to the base of transistor T14, and the base of transistor T3 is connected to output terminal OA1. The collector of transistor T4 is connected directly to bias potential $V_{CC}$, and the base of transistor T4 is connected to output terminal OA2. In circuit 24', the collector of transistor T3' is connected directly to bias potential $V_{CC}$, and the base of transistor T3' is connected to output terminal OA1. The collector of transistor T4' is connected to circuit node P, and the base of transistor T4' is connected to output terminal OA2.

Describing now the operation of circuit 40, in a manner well known to those skilled in the art, logical OR circuit 42 is responsive to differential input signal pairs applied on terminals IA1, IA2 and IB1, IB2, for generating differential output signals on terminals OA1, OA2. A truth table illustrating the operation of logical OR circuit 42 is shown in FIG. 9, and requires no further explanation herein. It will be appreciated that, because of the operation of emitter-follower transistors T13, T14, the output signal on terminal OA1 follows the signal at node P, minus one diode drop across the base-emitter junction of transistor T13. Similarly, the output signal of terminal OA2 follows the signal at node N, minus one diode drop across the base-emitter junction of transistor T14.

In the operation of circuit 40, test circuits 24, 24', are selectively enabled, one at a time, to operate in a manner identical to that described above with respect to FIGS. 5 and 7. That is, the enabled one of circuits 24, 24' senses the potential difference between the logical signals present on output terminals OA1, OA2, and responsively steers the current developed from bias potential $V_{EE}$ either to produce a stuck-at-level fault (when a stuck-near-threshold fault is detected) or to leave the logical output of circuit 42 unaltered (when no stuck-near-threshold fault is detected). This operation being described in detail with respect to FIGS. 5 and 7, it is not necessary to describe the same again. What will be described now is the selective operation of test circuits 24, 24' to detect specific hardware errors which might be undetectable with just one of the test circuits.

Describing first the detection of an open collector fault at transistor T6, with input signals IA1=1, IA2=0, IB1=1, IB2=0, test circuit 24' will detect the stuck-near-threshold fault, while test circuit 24 will not. With inputs IA1=0, IA2=1, IB1=0, IB2=1, test circuit 24 will detect the stuck-near-threshold fault, while test circuit 24' will not. An open collector fault at transistor T11 can only be detected with inputs IA1=0, IA2=1, IB1=1, IB2=0, and with test circuit 24'. In a like manner, an open collector fault at transistor T12 can only be detected with inputs IA1=0, IA2=1, IB1=0, IB2=1, and with test circuit 24.

It will be appreciated that the above-described description of circuit faults detectable only with selected inputs and one of circuits 24, 24' is intended to be exemplary, and not exhaustive.

In addition to detecting stuck-near-threshold faults caused by internal circuit defects of the type described immediately above, the present invention is also operable to effectively detect short circuit faults present on certain chip interconnect lines (not shown) at certain logic states. More specifically, circuits 24, 24' operate to detect a short circuit between the interconnect lines used to connect the outputs of a previous logic stage (not shown) to circuit input terminals IB1, IB2, and a short circuit between one of output lines OA1, OA2 and the adjacent output line of another logic circuit (not shown).

The former of the two above-described short circuits, a short between input terminals IB1, IB2, is detectable when IA1=0, IA2=1. With IB1=0, IB2=1, the short is detectable by circuit 24. With IB1=1, IB2=0, the short is detectable by circuit 24'. In each of these instances, the short circuit fault will manifest itself as a stuck-at-threshold fault. This stuck-at-threshold fault will, of course, be forced to a stuck-at-logic-level fault through the operation of test circuits 24, 24'.

The latter of the two above-described short circuits, a short between adjacent output lines of logic circuits, is likewise detectable whenever the short manifests itself as a stuck-near-threshold fault in logic circuit 42. Such manifestation would occur in approximately 50 percent of the possible logical states of circuit 42, and would again be converted by test circuits 24, 24' to appear as a stuck-at-logic-level fault.

There is thus provided a method and apparatus for detecting stuck-near-threshold faults in differential current switching logic circuits. The present invention operates to manifest such stuck-at-threshold faults as stuck-at-logic-level faults, the latter being readily detectable using known techniques. The present invention further has the advantage of detecting certain otherwise difficult to detect, short circuit faults. The method and apparatus of the present invention requires only small logical signal swings, permitting fast logic circuit operation, and can be implemented with a small number of readily available components. Further, the present invention does not require an inherent potential bias to be established between the output terminals of the DCS logic circuit, and thus does not decrease the noise margins of the circuit. The present invention has particular application in the testing of logic circuits embedded on integrated circuit chips.

While the invention has been shown and described with respect to a specific embodiment, it will be understood by those skilled in the art that various changes in form and scope may be made without departing from the spirit and scope of the invention.

What is claimed is:

1. A method of testing an electronic logic circuit of the type responsive to an input signal for generating first and second differential output signals, said method comprising the steps of:
   applying said input signal to said logic circuit;
   sensing, by comparing at least two discrete signals, said potential difference between said first and second differential output signals; and
   shifting, when said potential difference is less than a stuck-near-threshold level, said first and second differential output signals at least a minimum potential difference apart.

2. A method in accordance with claim 1 wherein said logic circuit includes a bias potential, at least one resistor connected to said bias potential, and means responsive to said input signal for sinking a first current through said resistor so as to generate said output signal at said resistor.

3. A method in accordance with claim 2 wherein said shifting step includes shifting the level of said first current to shift said output signal.

4. A method in accordance with claim 1 and further including the step of comparing said output signal with an expected output signal so as to detect an error in the operation of said logic circuit.

5. Means for testing an electronic logic circuit of the type responsive to an input signal for generating first and second differential output signals, comprising:
   means for applying said input signal to said logic circuit;
   means for sensing, including means for comparing at least two discrete signals, said potential difference between said first and second differential output signals; and
   means for shifting, when said potential difference is less than a stuck-near-threshold level, said first and second differential output signals at least a minimum potential difference apart.

6. Apparatus in accordance with claim 5 wherein said logic circuit includes a bias potential, at least one resistor connected to said bias potential, and means responsive to said input signal for sinking a first current through said resistor so as to generate said output signal at said resistor.

7. Apparatus in accordance with claim 6 wherein said shifting means includes means for shifting the level of said first current to shift said output signal.

8. Apparatus in accordance with claim 5 and further including means for comparing said output signal with an expected output signal so as to detect an error in the operation of said logic circuit.

9. A method of testing a differential current switching logic circuit of the type including a bias potential, two resistors connected to said bias potential, and means responsive to an input signal for sinking a first current through a selected one of said resistors so as to generate first and second differential output signals at said resistors, said method comprising the steps of:
   applying said input signal to said logic circuit;
   sensing the potential difference between said first and second differential output signals; and
   sinking, when said potential difference is less than a stuck-near-threshold level, a second current through a selected one of said resistors so as to lower the potential of the output signal associated with said one resistor relative to the potential of the output signal associated with the other of said resistors.

10. Apparatus for testing a differential current switching logic circuit of the type including a bias potential, two resistors connected to said bias potential, and means responsive to an input signal for sinking a first current through a selected one of said resistors so as to generate first and second differential output signals at said resistors, comprising:

means for applying said input signal to said logic circuit;

means for sensing the potential difference between said first and second differential output signals; and means for sinking, when said potential difference is less than a stuck-near-threshold level, a second current through a selected one of said resistors so as to lower the potential of the output signal associated with said one resistor relative to the potential of the output signal associated with the other of said resistors.

11. A method of testing a differential current switching logic circuit of the type including a bias potential, two resistors connected to said bias potential, and means responsive to an input signal for sinking a first current through a selected one of said resistors so as to generate first and second differential output signals at said resistors, said method comprising the steps of:

applying said input signal to said logic circuit;

sensing the potential difference between said first and second differential output signals;

sinking, when said potential difference is less than a stuck-near-threshold level, a second current through a selected one of said resistors so as to lower the potential of the output signal associated with said one resistor relative to the potential of the output signal associated with the other of said resistors; and comparing said first and second output signals with expected output signals so as to detect an error in the operation of said logic circuit.

12. A method in accordance with claim 11 wherein said step of sinking said second current comprises:

steering said second current, when said potential difference is less than a predetermined level, through said one resistor; and steering said second current, when said potential difference is greater than a predetermined level, through a circuit path selected so as not to change the polarity of the potential difference between said first and second output signals.

13. A method in accordance with claim 12 wherein said step of steering said second current through a circuit path comprises selectively steering said second current directly to said bias potential or steering said second current through a selected one of said resistors in a manner so as to enhance the potential difference already established between said first and second output signals.

14. Apparatus for testing a differential current switching logic circuit of the type including a bias potential, two resistors connected to said bias potential, and means responsive to an input signal for sinking a first current through a selected one of said resistors so as to generate first and second differential output signals at said resistors, said apparatus comprising:

means for applying said input signal to said logic circuit;

means for sensing the potential difference between said first and second differential output signals;

means for sinking, when said potential is less than a stuck-near-threshold level, a second current through a selected one of said resistors so as to lower the potential of the output signal associated with said one resistor relative to the potential of the output signal associated with the other of said resistors; and means for comparing said first and second output signals with expected output signals so as to detect an error in the operation of said logic circuit.

15. Apparatus in accordance with claim 14 wherein said sinking means comprises:

means for steering said second current, when said potential difference is less than a predetermined level, through said one resistor; and means for steering said second current, when said potential difference is greater than a predetermined level, through a circuit path selected so as not to change the polarity of the potential difference between said first and second output signals.

16. Apparatus in accordance with claim 15 wherein said means for steering said second current through a circuit path comprises means for selectively steering said second current directly to said bias potential or to a selected one of said resistors so as to enhance the potential difference already established between said first and second output signals.

17. Apparatus in accordance with claim 16 wherein said differential current switching logic circuit and said apparatus each comprise bipolar transistors.

18. Apparatus for testing a differential current switching logic circuit of the type including a bias potential, two resistors connected to said bias potential, and means responsive to an input signal for sinking a first current through a selected one of said resistors so as to generate first and second differential output signals at said resistors, said apparatus comprising:

first, second, and third transistors each having first and second terminals for conducting a current responsive to a signal applied to a control terminal;

means for supplying a current;

said first transistor having a first terminal connected to said current supplying means, and a second terminal connected to a circuit node;

said second transistor having a first terminal connected to said circuit node, a second terminal connected to said bias potential, and a control terminal connected to sense the potential at a selected one of said resistors; and said third transistor having said first terminal connected to said circuit node, said second terminal connected to said selected resistor, and said control terminal connected to sense the potential at the other of said resistors.

19. Apparatus in accordance with claim 18 wherein said differential current switching logic circuit comprises:

fourth and fifth transistors having first and second terminals for conducting a current responsive to a signal applied to a control terminal;

said fourth transistor configured as an emitter-follower having a control terminal connected to said one resistor and a first 11 terminal connected to said bias potential; and said fifth transistor configured as an emitter-follower having a control terminal connected to said other resistor and said first terminal connected to said bias potential.

20. Apparatus in accordance with claim 19 wherein:

said control terminal of said second transistor is connected to said second terminal of said fourth transistor; and said control terminal of said third transistor is connected to said second terminal of said fifth transistor.

21. Apparatus in accordance with claim 20 wherein said second terminal of said third transistor is connected to said control terminal of said fourth transistor.

22. Apparatus for testing a differential current switching logic circuit of the type including a bias potential, two resistors connected to said bias potential, and means responsive to an input signal for sinking a first current through a selected one of said resistors so as to generate first and second differential output signals at said resistors, said apparatus comprising:

first, second, third, fourth, fifth, and sixth transistors, each having first and second terminals for conducting a current responsive to a signal applied to a control terminal;

first and second means for supplying a current;

said first transistor having a first terminal connected to said first current supplying means, node;

said second transistor having a first terminal connected to said first circuit node, a second terminal connected to said bias potential, and a control terminal connected to sense the potential at a selected one of said resistors;

said third transistor having a first terminal connected to said circuit node, a second terminal connected to said selected resistor, and a control terminal connected to sense the potential at the other of said resistors;

said fourth transistor having a first terminal connected to said second current supplying means, and a second terminal connected to a second circuit node;

said fifth transistor having a first terminal connected to said second circuit node, a second terminal connected to said bias potential, and a control terminal connected to sense the potential at said other resistor;

said sixth transistor having a first terminal connected to said second circuit node, a second terminal connected to said other resistor, and a control terminal connected to sense the potential at said one resistor.

* * * * *